(12) United States Patent
Gurrum et al.

(10) Patent No.: US 11,538,742 B2
(45) Date of Patent: Dec. 27, 2022

(54) PACKAGED MULTICHIP MODULE WITH CONDUCTIVE CONNECTORS

(71) Applicant: Texas Instruments Incorporated, Dallas, TX (US)

(72) Inventors: Siva Prakash Gurrum, Allen, TX (US); Manu J. Prakuzhy, Allen, TX (US); Saumya Gandhi, Irving, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 24 days.

(21) Appl. No.: 16/848,774

(22) Filed: Apr. 14, 2020

(65) Prior Publication Data

US 2020/0243428 A1 Jul. 30, 2020

Related U.S. Application Data

(63) Continuation of application No. 16/032,958, filed on Jul. 11, 2018, now Pat. No. 10,622,290.

(51) Int. Cl.
*H01L 23/48* (2006.01)
*H01L 23/495* (2006.01)
*H01L 23/00* (2006.01)
*H01L 21/56* (2006.01)

(52) U.S. Cl.
CPC ...... *H01L 23/49575* (2013.01); *H01L 21/563* (2013.01); *H01L 23/4951* (2013.01); *H01L 23/49548* (2013.01); *H01L 23/49582* (2013.01); *H01L 24/09* (2013.01); *H01L 24/49* (2013.01)

(58) Field of Classification Search
CPC .......... H01L 23/49575; H01L 23/4951; H01L 23/49582; H01L 23/49548
USPC ................................................. 257/692, 666
See application file for complete search history.

(56) References Cited

U.S. PATENT DOCUMENTS

| | | | |
|---|---|---|---|
| 4,878,106 A | 10/1989 | Sachs | |
| 5,016,082 A | 5/1991 | Roth | |
| 5,250,843 A * | 10/1993 | Eichelberger | H01L 23/538 |
| | | | 257/E21.705 |
| 6,200,832 B1 * | 3/2001 | Ahmad | H01L 23/4951 |
| | | | 427/208 |
| 6,342,727 B1 * | 1/2002 | Fujimori | H01L 23/49572 |
| | | | 257/668 |
| 6,768,186 B2 | 7/2004 | Letterman, Jr. et al. | |
| 7,479,691 B2 | 1/2009 | Ewe et al. | |

(Continued)

*Primary Examiner* — Nitin Parekh
(74) *Attorney, Agent, or Firm* — Dawn Jos; Frank D. Cimino (57) ABSTRACT

In a described example, a packaged device includes a substrate having a device mounting surface including a first layer of conductive material having a first thickness less than a substrate thickness, the substrate having a second layer of the conductive material having a second thickness less than the substrate thickness. A first semiconductor device is mounted to a first area of the device mounting surface; and a second semiconductor device is mounted to a second area on the device mounting surface and spaced from the first semiconductor device. At least two connectors are formed of the first layer of the substrate having first ends coupled to one of first bond pads on the first semiconductor device and the at least two connectors having second ends coupled to one of second bond pads on the second semiconductor device.

18 Claims, 6 Drawing Sheets

(56) References Cited

U.S. PATENT DOCUMENTS

| | | | |
|---|---|---|---|
| 9,111,949 B2* | 8/2015 | Yu | H01L 23/5389 |
| 9,443,824 B1* | 9/2016 | We | H01L 25/0655 |
| 2004/0000702 A1 | 1/2004 | Knapp et al. | |
| 2005/0116322 A1 | 6/2005 | Sando et al. | |
| 2009/0093090 A1 | 4/2009 | Ewe et al. | |
| 2013/0127029 A1 | 5/2013 | Lee et al. | |
| 2014/0264839 A1* | 9/2014 | Tsai | H01L 21/565 257/737 |
| 2015/0194375 A1 | 7/2015 | Gowda et al. | |
| 2016/0247751 A1 | 8/2016 | Kinzer | |
| 2016/0284629 A1* | 9/2016 | Shea | H01L 23/4951 |
| 2019/0109117 A1* | 4/2019 | Fang | H01L 21/6835 |
| 2019/0295952 A1* | 9/2019 | Sikka | H01L 24/17 |
| 2019/0304914 A1* | 10/2019 | Koh | H01L 23/3135 |
| 2020/0098692 A1* | 3/2020 | Lift | H01L 24/16 |
| 2020/0266149 A1* | 8/2020 | Xu | H01L 21/4864 |

\* cited by examiner

PACKAGED MULTICHIP MODULE WITH CONDUCTIVE CONNECTORS

This application is a continuation of U.S. patent application Ser. No. 16/032,958, filed Jul. 11, 2018, the contents of all of which are herein incorporated by reference in its entirety.

TECHNICAL FIELD

This disclosure relates generally to integrated circuits, and more particularly to integrated circuits with a semiconductor device that is packaged with additional devices and covered in mold compound to form a multichip module.

BACKGROUND

Increasing integration of devices enables smaller finished systems and products, and multiple devices are often packaged together to increase integration. For example, a high voltage or high current capable field effect transistor (FET) semiconductor device may be packaged with a gate driver circuit on a second semiconductor device. The gate driver supplies the gate voltage to operate the high voltage FET. Because the two devices may be fabricated in different semiconductor technologies, the two functions are provided on separate semiconductor devices. In an alternative example, an analog integrated circuit having active devices such as transistors may be packaged in a single module alongside a passive integrated circuit device that includes sensors, photocells, inductors, capacitors or resistors that are used in conjunction with the analog integrated circuit to form a complete circuit in a single packaged device. In still additional examples, a general purpose processor may be packaged with a specialized co-processor to enhance performance of a processing unit.

Packages that contain two or more semiconductor devices in a single package are referred to as "multichip modules." To couple a multichip module to a system board, a surface mount multichip module package includes external terminals for mounting to the system board. In an example, a quad flat no-lead (QFN) package or dual flat no-lead (DFN) package is used which has terminals on at least one, and up to four, sides of a rectangular or square molded flat package. The no-lead terminals lie within the area of the body of the package. In an alternative, a "leaded" package has leads that extend away from the body of the package. The leads may be formed to have surfaces co-planar with the body of the package for use in surface mounting. In one example the semiconductor devices within a QFN package can be mounted "face up" (with the active surface oriented away from the leads of the package) and arranged on a substrate, such as a conductive lead frame, that has two or more device mounting areas. Wire bond or ribbon bond connections are made between bond pads on the semiconductor devices and leads of the lead frame for making connections. The lead frame includes conductive lead portions that form the external terminals of the finished multichip module package. Face up and wire bonded multichip module packages can require a large system board area, as the mounted semiconductor devices have to be spaced apart to allow room within the multichip module for the wire bond connections to be made to leads of the lead frame. Another approach uses "flip chip" or face down orientation of the semiconductor devices with respect to the substrate. In a flip chip package the semiconductor devices have conductive posts or pillars formed on the bond pads on the active surface of the semiconductor devices. The pillars extend from the active surface but lie within the surface area of the semiconductor device. The semiconductor devices are then turned face down, or "flipped", so the active surface faces the mounting surfaces of substrate, for example a leadframe. The ends of the posts or pillars are bonded to the pads on the leadframe using solder and/or flux in a thermal reflow process. Because the electrical connections in a flip chip package are made beneath and within the area of the semiconductor devices, the board area for the flip chip multichip package that is needed on a system board is somewhat reduced (when compared to a wire bonded arrangement). However the connections needed between the two semiconductor devices in the multichip module require the use of leads or wire bonds that also increase the overall package area.

SUMMARY

In a described example, a packaged device includes a substrate having a device mounting surface and an opposing surface. The substrate has a substrate thickness and includes a first layer of conductive material having a first thickness less than substrate thickness, the first layer including the device mounting surface, the substrate also has a second layer of the conductive material having a second thickness less than the substrate thickness, the second layer including the opposing surface. A first semiconductor device having first bond pads on an active surface is mounted to a first area of the device mounting surface; and a second semiconductor device having second bond pads on an active surface is mounted to a second area on the device mounting surface and spaced from the first semiconductor device. At least two connectors are formed of the first layer of the substrate, the at least two connectors having first ends coupled to one of the first bond pads on the first semiconductor device and the at least two connectors having second ends coupled to one of the second bond pads on the second semiconductor device.

DETAILED DESCRIPTION

Corresponding numerals and symbols in the different figures generally refer to corresponding parts unless otherwise indicated. The figures are not necessarily drawn to scale.

The arrangements disclosed herein are applicable to many multichip module devices. While an example is described using two semiconductor devices, more than two devices can be packaged in the arrangements. In another alternative arrangement, an integrated circuit can be packaged with passive devices that are themselves formed in another semiconductor device; as an integrated circuit or provided as discrete devices. High voltage components such as an FET device can be provided as a discrete device and packaged in the multichip module with another semiconductor device containing passives such as inductors, or with an integrated circuit, for example with a gate driver circuit. Sensors or analog to digital converter ICs can be packaged with a digital integrated circuit to form a system on a chip (SOC or SOIC) packaged device. A packaged device that includes multiple semiconductor devices can be referred to as a system in a package (SIP).

Connections are needed in the multichip module to couple signals between the devices in the module. Wire bonding between devices requires area in the packaged device sufficient to allow the bond wires to be placed. Finer pitch and reduced area packages can be used, but at substantial additional cost. A grid array quad flat no lead package (GQFN) can be used but requires complex etch steps and a complex lead frame design. Molded interconnect substrate (MIS) packages include a substrate with a lead frame disposed in a premold insulator compound to form a base. The integrated circuits are wire bonded or flip chip mounted to the substrate, and additional molding and etching steps are needed, along with plating of conductive studs, to complete the MIS package, increasing costs.

In the arrangements, the problem of electrically connecting semiconductor devices to one another in a multichip module is solved by the use of conductive connectors formed of the same material as a portion of the substrate that the semiconductor devices are mounted on.

In the arrangements, at least two and sometimes many conductive connectors or connectors are provided to couple the devices in the multichip module to one another. In an example, the conductive connectors are formed as part of and provided with a conductive lead frame. In alternative arrangements, the conductive connectors are formed as a part of a substrate for mounting devices, for example, a molded interconnect substrate (MIS), a laminate or tape based substrate, a printed circuit board (PCB), or a pre-molded leadframe (PMLF) that includes leads and mold compound in a substrate. The conductive connectors or connectors are initially provided physically connected together. In an example the connectors are connected with removable portions of the lead frame, referred to as "tie bars." In an example the tie bars are also part of the lead frame, although in alternative examples other materials such as tape or resin can be used to provide the tie bars that connect the conductive connectors. As is further described hereinbelow, during assembly of the package the tie bars are removed to physically separate the conductive connectors from one another after semiconductor devices are mounted to the ends of the conductive connectors. The conductive connectors provide low resistance electrical connections between devices within the multichip module, without the need for additional bond wires or complex lead shapes, in a space efficient manner, and at low cost. The use of the arrangements provide a solution to a long-felt need for low cost and space-efficient connections between devices mounted on a substrate.

In an example the conductive connectors are arranged in parallel to one another in a portion of a lead frame between device mounting areas. However, the conductive connectors can be arranged in non-parallel configurations. In an additional arrangement the conductive connectors can be placed in other portions of the package. In an example a portion of a conductive connector can lie beneath a portion of a semiconductor device, or alternatively the conductive connectors can be placed between semiconductor devices so that no portion lies beneath a semiconductor device in the completed multichip module. The ends of the conductive connectors can be coupled to the semiconductor devices using bond wires, using ribbon bonds, using conductive pillars or posts with solder joints, or can otherwise be electrically coupled to a bond pad on a semiconductor device.

Figure 1A:
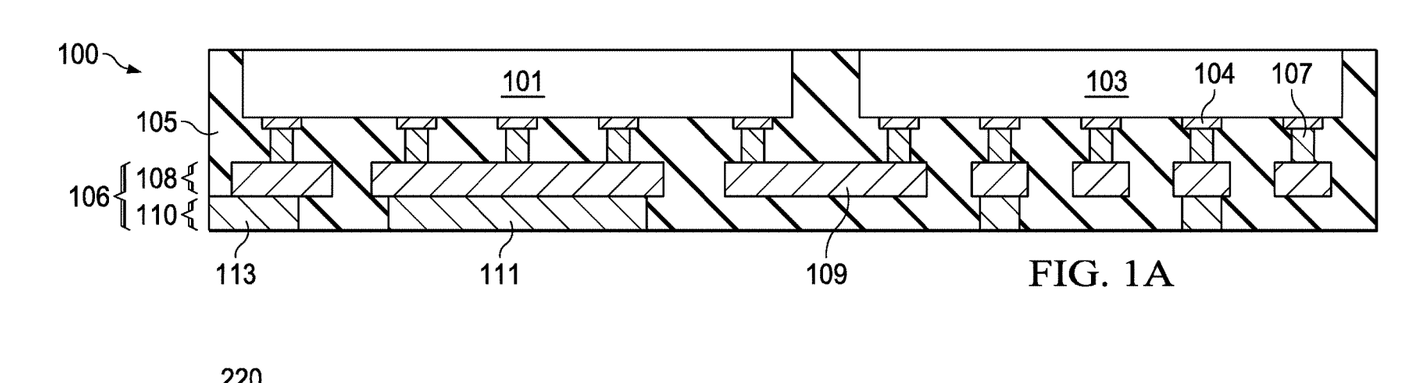
FIGS. 1A-1B are a cross section and a plan view, respectively, of an arrangement for a multichip module.
Figure 1B:
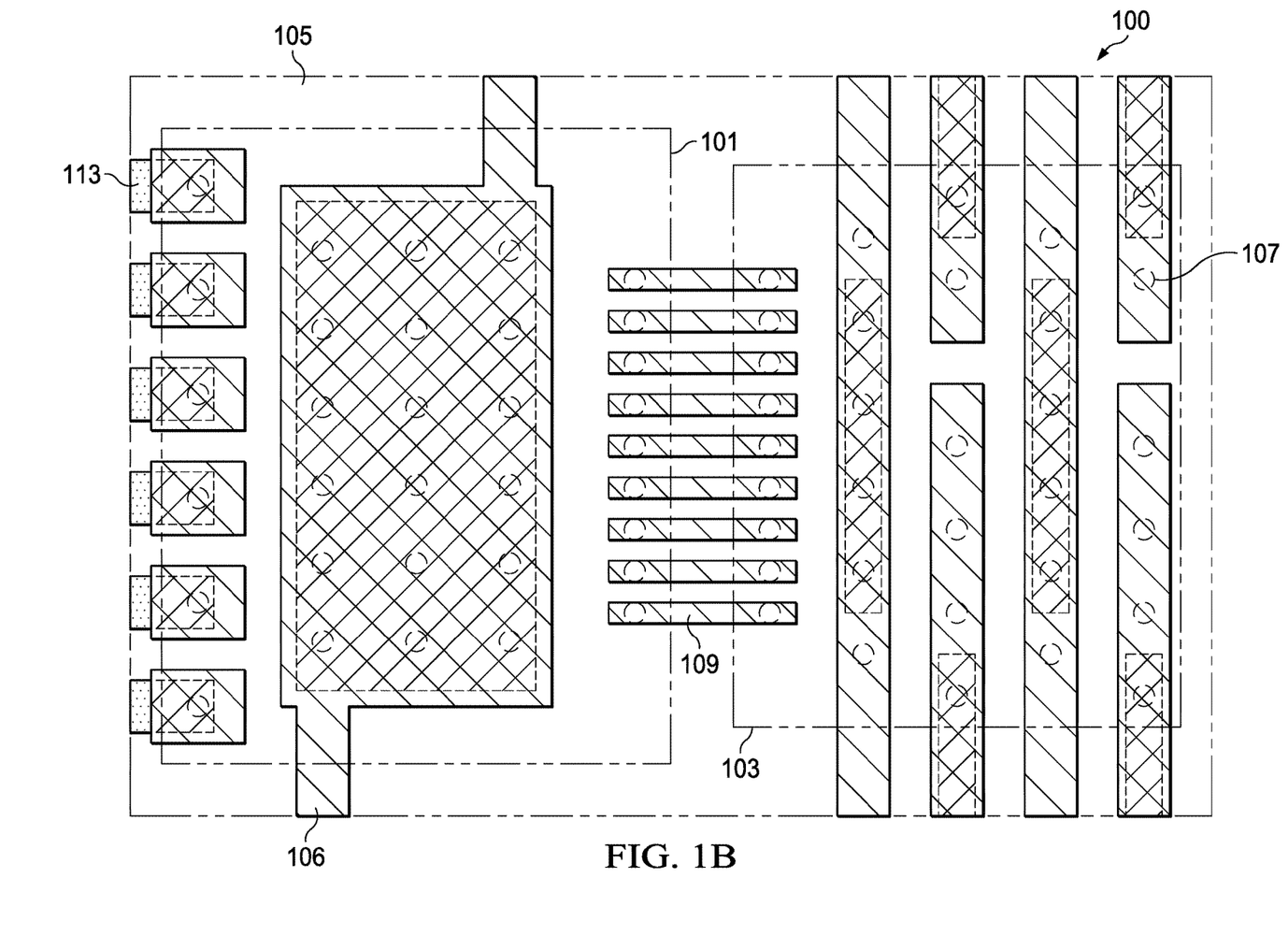

FIG. 1A is a cross sectional view of an example arrangement 100 for a multi-chip module including at least two semiconductor devices. FIG. 1B is a plan view of the multichip module.

In FIG. 1A, the example arrangement is packaged in a quad flat no lead (QFN) package with a body formed of a mold compound 105. Mold compounds useful for integrated circuits can be used, such as epoxy and epoxy resin. Thermoset resin epoxy molding compound with fillers to enhance thermal properties can be used. Transfer or injection mold equipment can be used to encapsulate the lead frame and the devices mounted to the lead frame. Note that as used herein, portions of the lead frame can remain uncovered by the mold compound even though the molding process is described as "encapsulation" and the semiconductor devices are referred to as "encapsulated." These portions can provide electrical terminals for the completed packaged device, or can provide thermal pads for heat transfer from the integrated circuits inside the completed packaged device.

In the example arrangement shown in FIGS. 1A and 1B, two integrated circuits 101 and 103 are mounted to die mounting areas on a first surface of a lead frame 106. In this example the lead frame 106 is formed using a "half-etch" process in manufacture to have two layers 108, and 110. As used herein, the term "half-etch process" means a process where a conductive lead frame, such as a copper lead frame, is patterned using etching. In an aspect portions of the entire thickness of the lead frame can be etched away to form patterned leads from a solid sheet of metal. In addition, the lead frame can subsequently be etched in a half-etch process from a first side, to remove part of the thickness from that side, leaving remaining material from a middle portion of the thickness and extending to the second side. In a final step of the half etch process, the lead frame can then be partially etched from the second side, removing portions of the material from the second side to a middle portion of the thickness, those portions extending from the middle portion to the first side. In this manner, the finished lead frame has some open areas where the total thickness is etched away, some portions or leads that have a thickness equal to the full thickness of the lead frame, some portions that have a thickness less than the full thickness which extend from a first surface to a middle portion of the thickness of the lead frame, and some portions which have a thickness less than the full thickness which extend from a second surface towards the first surface and from the second surface to a middle portion of the lead frame. In this arrangement, there are then three different portions: portions with a full thickness of the lead frame; portions with a partial thickness less than the full thickness extending from a first surface towards the middle; and portions with a partial thickness less than the full thickness extending from the second opposite surface to towards the middle. Although the partial etch process is referred to as a "half-etch" process, the partial thickness relationships can vary, for example the first thickness can be between 20-80% of the full thickness, and the second thickness can be between 80-20% of the full thickness. The sum of the partial thicknesses may be equal to the full thickness, or may be less than the full thickness.

Referring now to FIG. 1A, as the elements are oriented in FIG. 1A, the layer 108 is an upper layer. Portions of lead frame 106 that are in the layer 108 are wholly within the completed package after the mold compound 105 covers the devices and can be referred to as the "inner" leadframe. A second layer 110 is also formed in the half-etch process for manufacturing the lead frame 106. Layer 110, which as oriented in FIG. 1A is a lower layer of lead frame 106, can be referred to as the "outer" lead frame layer of lead frame 106. Layer 110 includes pads 111, which can be used as thermal pads to remove heat from the integrated circuits; and layer 110 also includes external terminals 113, which form signal terminals or voltage terminals for the completed package 105. During encapsulation processes to form the package 105, at least portions of external terminals 113 and pads 111 are left exposed and not covered by the mold compound of package 105. In this manner portions of lead frame 106 in layer 110 form the external electrical connections for the multichip module arrangement 100, while other portions of the lead frame 106 in layer 110 such as 111 form thermal paths. When the multi-chip module is later mounted to a printed circuit board using surface mount technology, a thermally conductive portion of the printed circuit board (not shown) can be placed in contact with the thermal pads 111 to enable thermal energy to be conducted away from multichip module 100. Alternatively, thermal pad 111 can be exposed to ambient or forced air to cool multichip module arrangement 100. In addition, thermal pad 111 can also be used as an electrical connection, for example to connect to ground.

FIG. 1B illustrates in a plan view the multichip module shown in FIG. 1A. The example arrangement 100 includes the first integrated circuit 101 and the second integrated circuit 103 mounted in a flip chip configuration to a substrate, here lead frame 106. The mold compound 105 forms the package of the arrangement 100. Conductive pillars 107 couple bond pads (not shown) on the integrated circuits 101, 103 to lands on the lead frame 106. Conductive connectors 109 are shown coupling the first integrated circuit 101 to the second integrated circuit 103. The conductive connectors 109 are formed in the layer 108 of lead frame 106 (see FIG. 1A). The exposed portions 113 of the lead frame 106 form terminals for the completed package of arrangement 100. Portions of the layer 110 of lead frame 106 form pads 111 that extend to the bottom surface of the arrangement 100 (see FIG. 1A).

Figure 2:
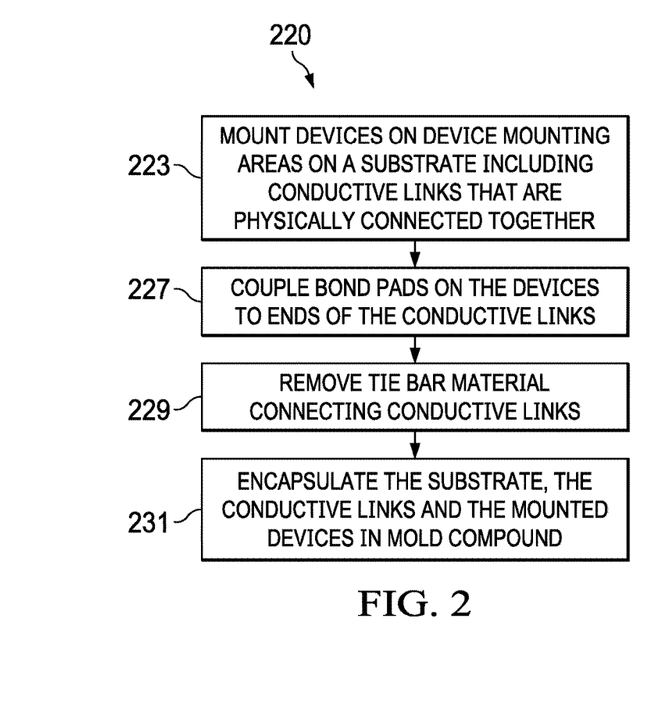
FIG. 2 is a flow diagram of a method for forming an arrangement.

FIG. 2 illustrates in a flow diagram a method 220 for forming the arrangements such as 100 in FIG. 1A. In FIG. 2, the method 220 begins at step 223 where semiconductor devices are mounted on device mounting areas of a substrate, for example a lead frame, that includes conductive connectors that are initially physically coupled together by tie bars, tape or other support. At step 227 the conductive connectors are coupled to bond pads on the integrated circuits. For example, the semiconductor devices can be flip chip mounted and conductive pillars can be bonded to each end of the conductive connectors as shown in FIG. 1A. At step 229, after the bonding step is complete in step 227, the tie bars (or alternatively, tape or other support material) connecting the conductive connectors can be removed. The connections from the conductive connectors to the semiconductor devices provide mechanical support for the conductive connectors after the semiconductor devices are mounted, so that after the tie bars connecting the conductive connectors are removed, the conductive connectors are mechanically supported. In an example process, a laser trim is used to remove the tie bar material, disconnecting each conductive connector from the other conductive connectors so the conductive connectors are electrically isolated. In an alternative arrangement, a mechanical trim process can remove the tie bars that form connections between the conductive connectors. In another example, a water jet can be used to abrasively remove the tie bars. In step 231, the substrate, the conductive connectors, the semiconductor devices, and the conductive pillars are covered in molding compound. A block molding operation can be used for several instances of the arrangement in FIG. 1B on a lead frame strip; after the mold compound is applied and cured, a singulation procedure using mechanical or laser saws cuts through the mold compound and the lead frame strip and separates the instances into individual packaged devices. A transfer molding operation using a mold chase to inject mold compound around each instance of the arrangement of FIGS. 1A-1B on a lead frame strip, followed by a singulation operation, can also be used.

Figure 3A:
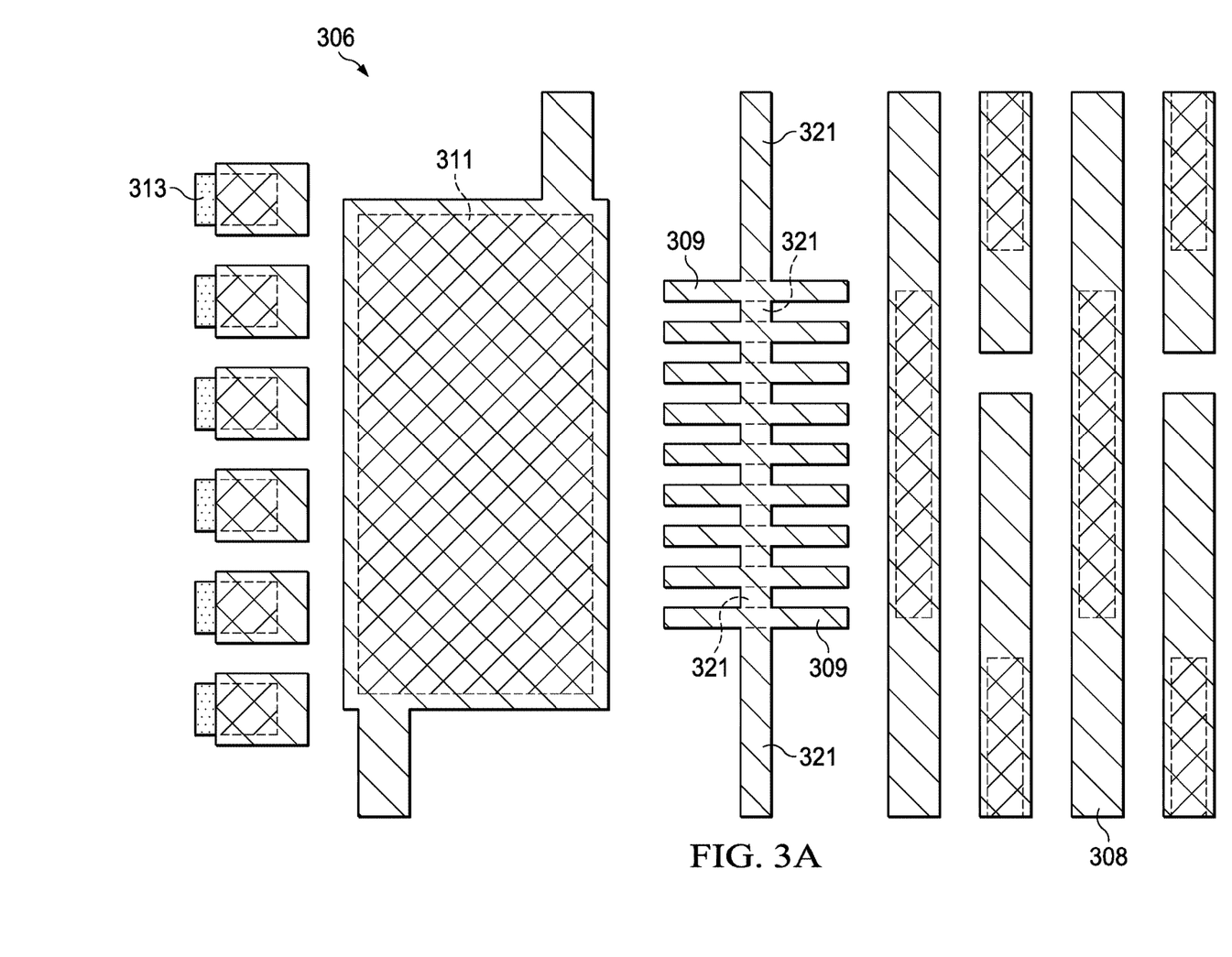
FIG. 3A is a plan view of a substrate for use with the arrangements.

FIGS. 3A-3D depict, in plan views and cross sections as further described hereinbelow, the results of some of the method steps of the flow diagram in FIG. 2. In step 223, the substrate includes conductive connectors. In FIG. 3A, an example substrate 306 is shown in a plan view, while in FIGS. 3B-3D, the example substrate 306 is shown in a series of cross sectional views illustrating a partial etch process. Substrate 306 can be, for example, a lead frame. In example arrangements, the lead frame can include two layers formed using a half-etch or partial etch process where portions of the lead frame have a full thickness, while other portions are partially etched to include only a partial thickness.

Figure 3B:
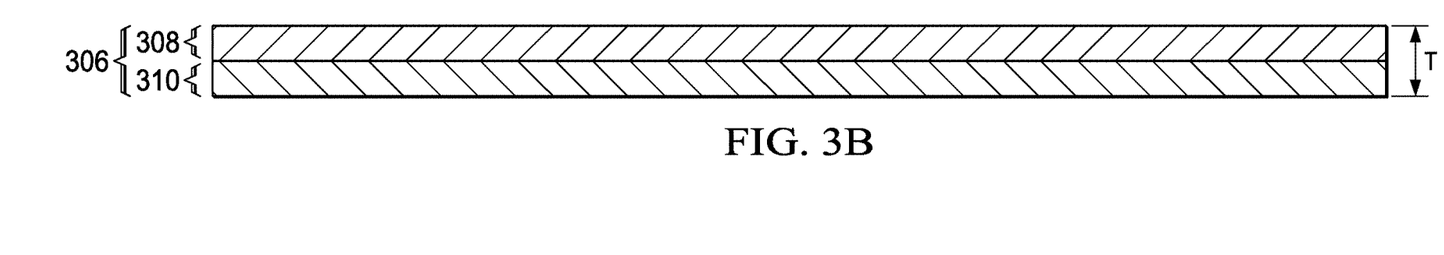
FIGS. 3B-3D illustrate in cross sectional views the result of partial etch processes to form the substrate of FIG. 3A.

In FIG. 3B, a lead frame 306 has a full thickness "T". The full thickness can be in a range from 50 µm to 500 µm. In a lead frame that is being processed in a partial etch process, the lead frame can be described as having a first layer 308 with a first thickness less than the full thickness, and having a second layer 310 with a second thickness that is less than the full thickness, so that the sum of the first and the second thicknesses approximately equals the full thickness of substrate 306.

In a partial etch process, the lead frame will be etched partially from one side, patterning one of the first and second layers, and then will be etched partially from the opposing side, patterning the remaining one of the first and second layers. In areas where the etch removes both the first and second layers, an opening can be formed, patterning leads or die mounting pads for example. In areas where the etch removes none of the first and second layers, a full thickness portion will be formed. In areas where etch removes only one of the first and second layers, the remaining material will form a portion with a thickness less than the full thickness in either the first layer or in the second layer.

Figure 3C:
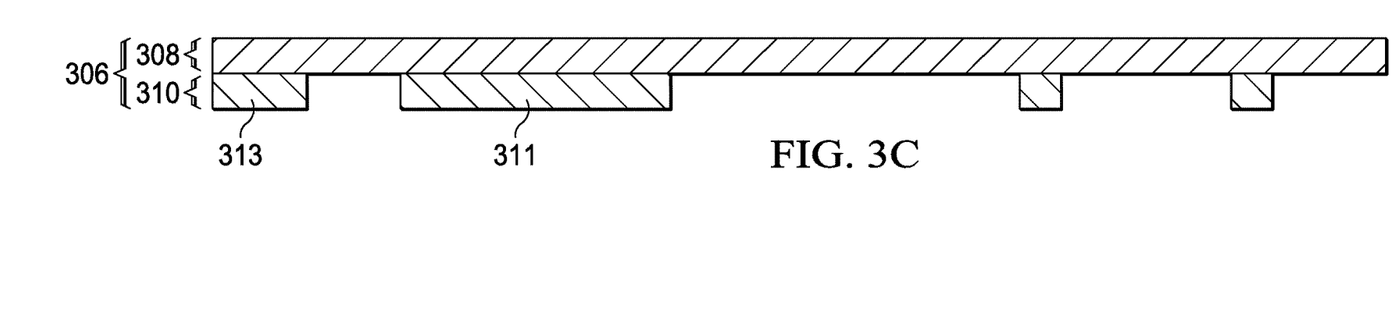

FIG. 3C illustrates in a cross section the lead frame 306 after a partial etch of the layer 310 is performed. In FIG. 3C, the layer 310 is shown after a chemical etch forms terminals 313, and portions 311 beneath layer 308. These portions are on a surface opposing the die mounting areas on the lead frame and can form thermal pads or power or ground pads that will be exposed from the final package as is further described hereinbelow.

Figure 3D:
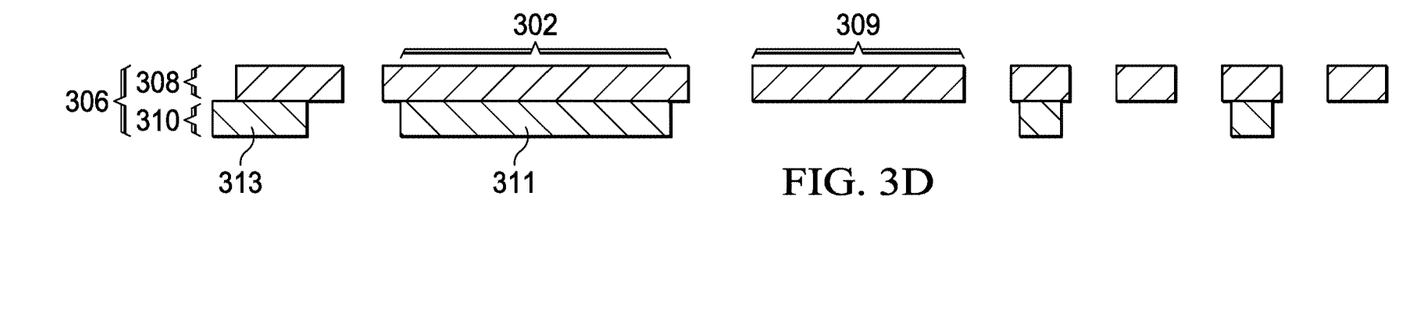

FIG. 3D illustrates in a cross section the lead frame 306 after a second partial etch is performed on layer 308 to complete the lead frame patterning. In FIG. 3D, a die mounting area 302 is formed with a portion that has a full thickness. Conductive connectors 309 are formed with a partial thickness only in the layer 308. In an example arrangement, the tie bars such as 321 in FIG. 3A are also formed in layer 306, (note the tie bars 321 are not visible in the cross sectional views of 3B-3D.) After the tie bars are removed, this portion including connectors 309 will be completely enclosed in mold compound in the completed package, as is further described hereinbelow. In an example, layer 308 including the conductive connectors 309 has a thickness approximately half of the total thickness. However, the partial etch process used to pattern lead frame 306 can produce a range of thicknesses in both layers, with the sum of the thicknesses of the layers 308, 310 being approximately equal to the full thickness of substrate 306.

Figure 4A:
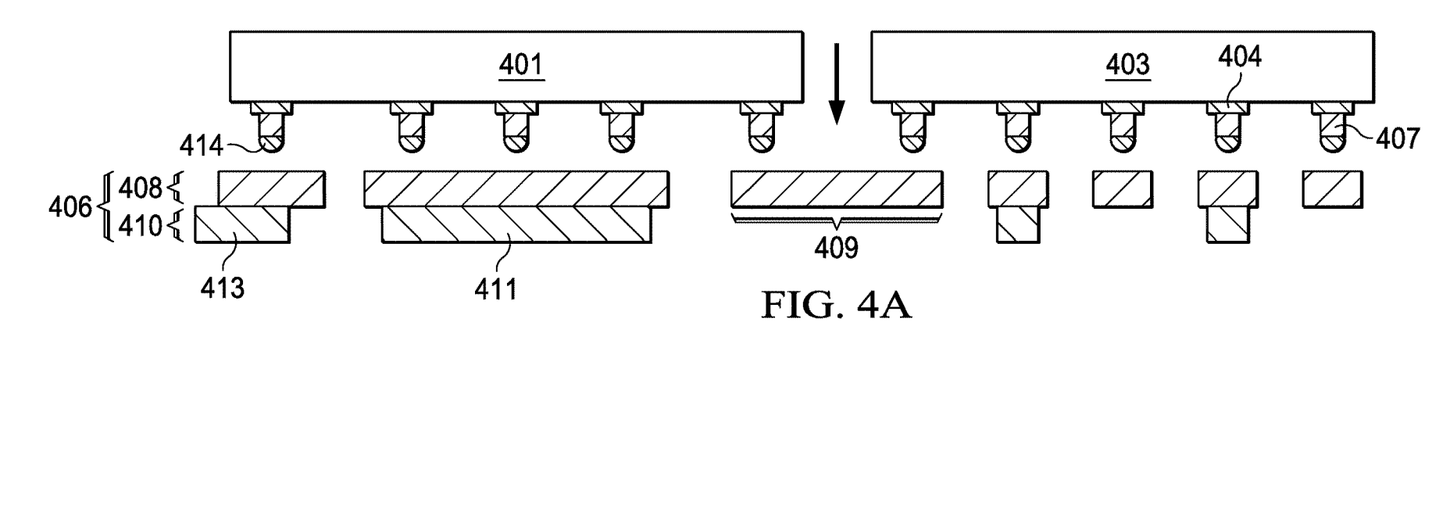
FIGS. 4A-4C illustrate in cross sections and a plan view the results of certain steps of the method of FIG. 2 to form an arrangement.

Returning to the method 220 in FIG. 2, at step 223 the semiconductor devices are mounted to the substrate that includes the conductive connectors. The lead frame 306 in FIG. 3D is the substrate. At step 223 the devices are mounted on the substrate in device mounting areas. FIG. 4A illustrates this step. The reference labels used in FIG. 4A for similar elements correspond to the reference labels used in FIGS. 3A-3D are, for clarity. For example, lead frame 406 corresponds to lead frame 306 in FIG. 3D.

In FIG. 4A, lead frame 406 has a first semiconductor device 401 and a second semiconductor device 403 aligned with die mounting areas on a first surface of the lead frame, the first and second semiconductor devices 401, 403 having bond pads 404 with conductive pillars 407 and solder bumps 414 extending from an active surface of each semiconductor device and mounted on the bond pads 404 for flip chip mounting.

In FIG. 4A, ends of the conductive connectors 409 are aligned with conductive pillar bumps of each of the semiconductor devices 401, 403. The terminals 413 are aligned with individual conductive pillar bumps of semiconductor device 401, while a pad 411 is shown coupled to several pillar bumps of semiconductor device 401. Pad 411 may be used as a voltage or ground terminal for the packaged device, or may be a thermal pad for the packaged device, or a combination of these.

Figure 4B:
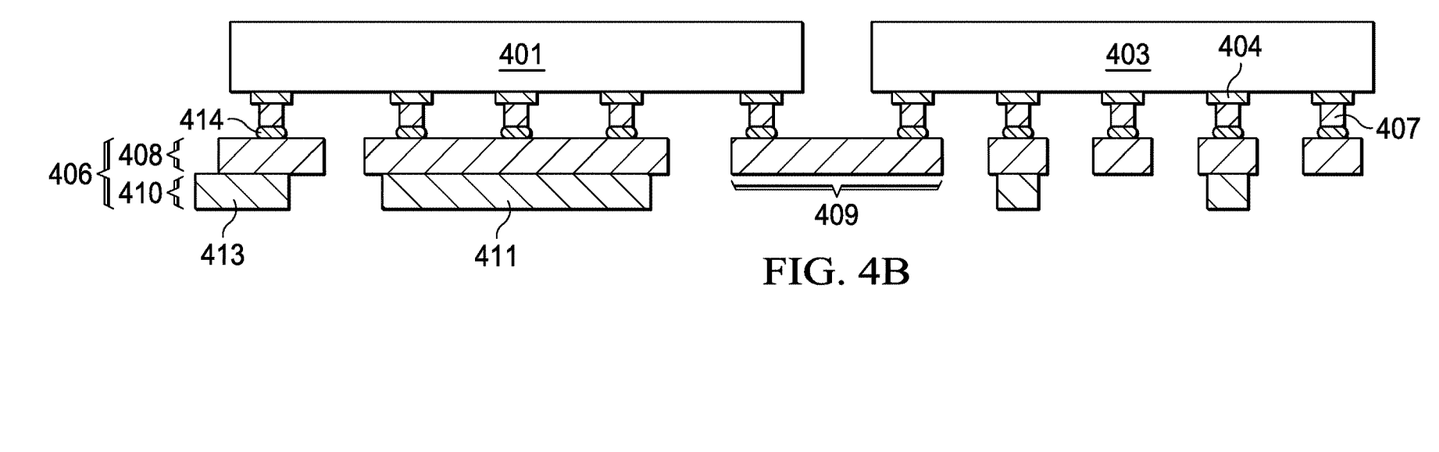

FIG. 4B illustrates the arrangement following steps 223 and 227 in the method of FIG. 2. In FIG. 4B, semiconductor device 401 is mounted on a die mounting area of lead frame 406 that is part of the first layer 408. Semiconductor device 403 is mounted a second die mounting area that is also a part of the first layer 408. The conductive connectors 409 have ends connected to the semiconductor device 401 and to the semiconductor device 403 to form electrical connections between semiconductor device 401 and semiconductor device 403 in the layer 408 of the lead frame 406. Use of the conductive connectors 409 formed of the lead frame 406 provides needed electrical connections between the semiconductor devices without the need for additional bond wires or other added connectors. The conductive connectors 409 are formed in and are part of the layer 408. When the package is completed with mold compound, the conductive connectors 409 will be entirely within the package body. Terminals 413, in contrast, are formed in the layer 410 and as is shown for terminals 113 in FIG. 1A, will be exposed from the package body to allow external connections to the packaged devices. Terminals 413 are coupled to conductive pillars 407 of the semiconductor device 401 by solder bumps 414 and by a portion of the conductive layer 408. A pad 411 is shown coupled to conductive pillars that is also coupled to the semiconductor device 401. The pad 411 has a portion in layer 410 that will be exposed from the mold compound in the completed package, and in layer 408 to provide the die mounting area for the conductive pillar 407 of semiconductor device 401. The pad or terminal 411 may be a voltage or ground connection and may extend into the page to form a low resistance power rail for semiconductor device 401. Several of the pillars 407 may be coupled to terminal 411 to provide low resistance power connections or ground connections, for example, to a semiconductor device.

Figure 4C:
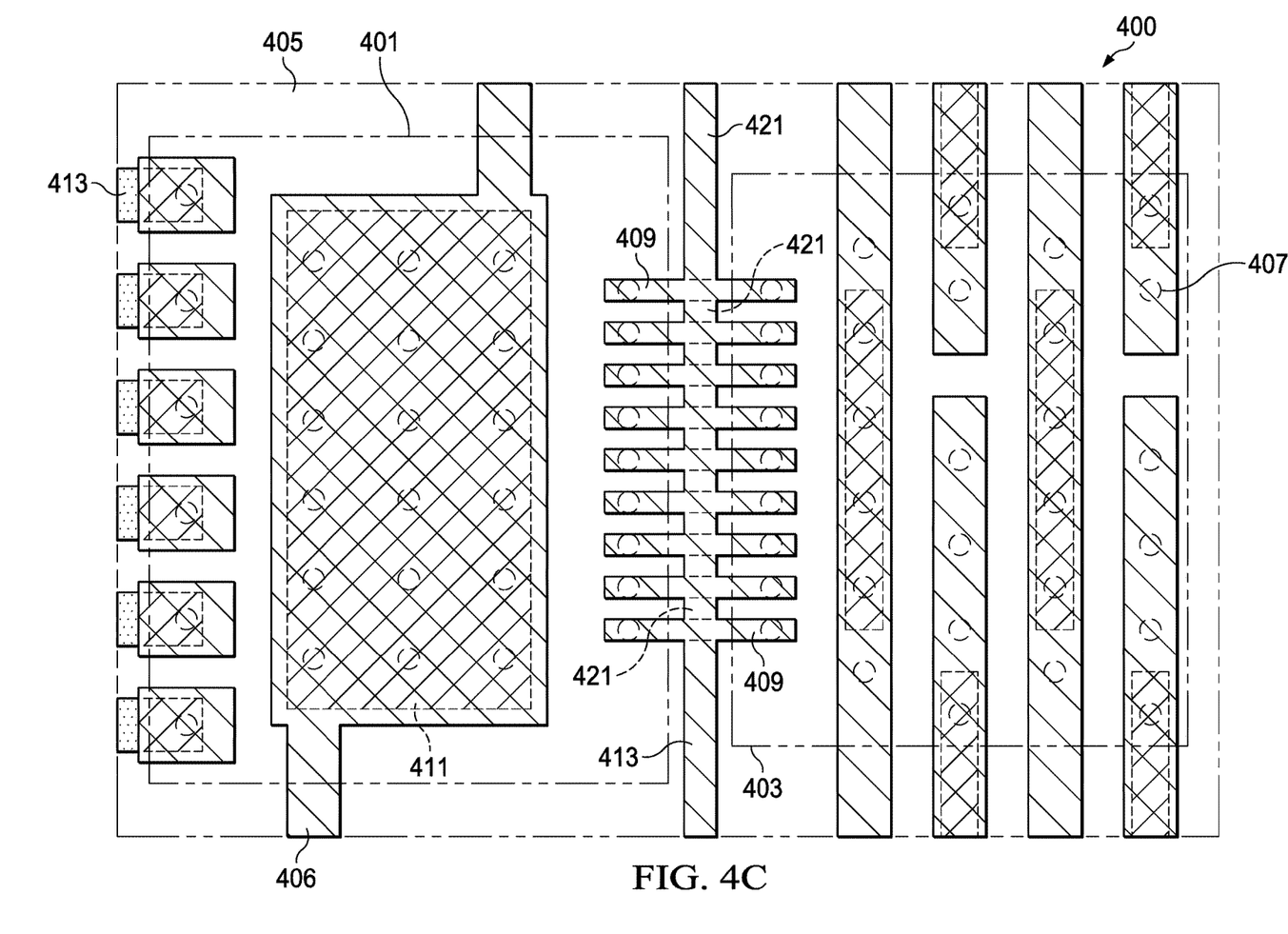

FIG. 4C illustrates in a plan view of the lead frame 406 with the semiconductor devices 401 and 403 mounted to the die mount areas. The conductive connectors 409 are shown having first ends lying beneath the semiconductor device 401 and second ends lying beneath the semiconductor device 403. Tie bars 421 support the conductive connectors 409 during the semiconductor device mounting operation. After the devices 401 and 403 are mounted, the solder connections made to the ends of the conductive connectors 409 support the conductive connectors 409.

Returning to FIG. 2, the method 220 continues at step 229. At step 229 the tie bars 421 are removed. In an example, the tie bars 421 are part of the layer 408 of the lead frame 406. In this example, the tie bar can be removed using a laser trimming operation. Mechanical trimming can also be used. In another example, a water jet can abrasively remove the tie bar. In still a further example, the tie bars 421 can be formed of a tape or other support and can be removed mechanically. After the tie bars 421 are removed, the conductive connectors 409 are isolated electrically and are physically separate from one another, see in FIG. 1B the conductive connectors 109, for example.

In FIG. 2, the method 220 continues. At step 231, the substrate, lead frame 406 in FIG. 4B, the semiconductor devices 401 and 403, and the conductive connectors 409, are covered in mold compound. The completed package is shown in FIG. 1A and FIG. 1B. The process for providing the mold compound is described as an encapsulation process, however the terminals 113 have surfaces that are exposed from the mold compound, and voltage pads such as 111 also have a surface exposed from the mold compound for making electrical and/or thermal contact to a system board.

Figure 5:
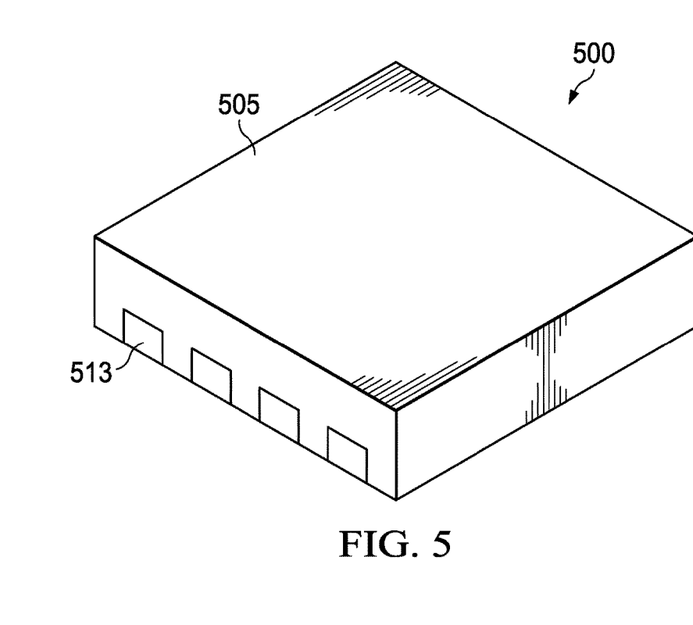
FIG. 5 is a projection view of a packaged device.

FIG. 5 is a projection view of a completed package 500. In FIG. 5, an example QFN package includes the package body of mold compound 505 with the exposed terminals 513 configured for surface mounting. The package 500 shown in FIG. 5 is a no-lead package. In alternative arrangements, additional package types can form additional arrangements including leaded packages where terminals are formed by leads that extend from the body of the package 500. The leads can have surfaces co-planar with the body of the package and can be surface mounted to a system board.

Modifications are possible in the described arrangements, and other alternative arrangements are possible within the scope of the claims.

What is claimed is:

1. A semiconductor package comprising:
   a substrate having half-etched patterned portions and including a first portion with a first thickness and a second portion with a second thickness;
   a first semiconductor device and a second semiconductor device electrically connected to the first portion;
   a first connector formed in the first portion, the connector electrically and mechanically connected to a first bond pad of each of the first semiconductor device and the second semiconductor device;
   a second connector formed in the first portion electrically and mechanically connected to a second bond pad of each of the first semiconductor device and the second semiconductor device; and
   a third connector formed in the first portion and the second portion, wherein the third connector electrically and mechanically connects to at least two of a third bond pad of the second semiconductor device.

2. The semiconductor package of claim 1, wherein a surface of the second portion is exposed from the semiconductor package.

3. The semiconductor package of claim 1, wherein a surface of the first semiconductor device and the second semiconductor device is exposed from the semiconductor package.

4. The semiconductor package of claim 1, wherein the first semiconductor device and the second semiconductor device are coplanar from a cross-sectional view of the semiconductor package.

5. The semiconductor package of claim 1, wherein active surfaces of the first semiconductor device and the second semiconductor device are connected to the first portion.

6. The semiconductor package of claim 1, wherein active surfaces of the first semiconductor device and the second semiconductor device are connected to the first portion via conductive posts.

7. The semiconductor package of claim 1 and further comprising mold compound covering the first semiconductor device, the second semiconductor device, the first connector and the second connector, and at least a portion of the substrate.

8. The semiconductor package of claim 1, wherein the substrate includes a substrate thickness and the first thickness and the second thickness are less than the substrate thickness.

9. The semiconductor package of claim 1, wherein the substrate includes a first set of leads connected to the first semiconductor device and a second set of leads connected to the first semiconductor device, and wherein first set of leads are oriented perpendicular to the second set of leads as seen in a plan view.

10. The semiconductor package of claim 1, wherein the substrate is a lead frame.

11. The semiconductor package of claim 10, wherein the lead frame is one selected from a group consisting essentially of: copper; copper alloy; brass; and Alloy 42.

12. A semiconductor package, comprising:
a the substrate having half-etched patterned conductive material layer and including a device mounting surface and an opposing surface, the substrate including a first layer of conductive material including a first thickness, and a second layer of the conductive material including a second thickness;
a first semiconductor device mounted to a first area of the device mounting surface;
a second semiconductor device mounted to a second area on the device mounting surface and spaced from the first semiconductor device;
at least two connectors formed of the first layer of conductive material of the substrate, and partially between the first semiconductor device and the second semiconductor device; wherein the substrate is a lead frame; and
a third connector formed of the first layer and the second layer, the third connector electrically connected to more than two bond pads of the second semiconductor device, the second layer exposed from the semiconductor package.

13. The semiconductor package of claim 12, wherein the substrate includes a substrate thickness, and wherein the first thickness and the second thickness are less than the substrate thickness.

14. The semiconductor package of claim 12, wherein the at least two connectors are arranged in parallel and extend between the first area and the second area.

15. The semiconductor package of claim 12, and further comprising mold compound covering the first semiconductor device, the second semiconductor device, the at least two connectors, and at least a portion of the substrate.

16. The semiconductor package of claim 12, wherein the first semiconductor device and the second semiconductor device further comprise conductive posts formed on first bond pads of the first semiconductor device and second bond pads of the second semiconductor device, the conductive posts having ends mounted to the device mounting surface of the substrate.

17. The semiconductor package of claim 12, wherein the substrate is a portion of the lead frame.

18. A package, comprising:
a portion of a lead frame having half-etched patterned portions and including first and second layers, a first device mounting area on a first surface of the first layer, a second device mounting area on the first surface, and connectors formed in the first layer between the first device mounting area and the second device mounting area formed in the first layer, and an opposing second surface formed in the second layer;
a first semiconductor device flip chip connected to the first device mounting area on the first surface;
a second semiconductor device flip chip connected to the second device mounting area on the first surface and spaced from the first semiconductor device;
at least two of the connectors coupled between the first semiconductor device and the second semiconductor device;
a third connector formed in the first layer and the second layer, wherein the third connector electrically and mechanically connects to at least two bond pads of the second semiconductor device; and
mold compound covering the at least two connectors, the first semiconductor device, the second semiconductor device, and the lead frame, wherein the at least two connectors include a rectangular cross-sectional shape.

* * * * *